(12) United States Patent
Lansbergen et al.

(10) Patent No.: US 9,983,487 B2
(45) Date of Patent: May 29, 2018

(54) RAPID EXCHANGE DEVICE FOR LITHOGRAPHY RETICLES

(71) Applicants: ASML Holding N.V., Veldhoven (NL); ASML Netherlands B.V., Veldhoven (NL)

(72) Inventors: Robert Gabriël Maria Lansbergen, Schiedam (NL); George Hilary Harrold, Redding, CT (US); Richard John Johnson, Danbury, CT (US); Hugo Jacobus Gerardus Van Der Weijden, Geldrop (NL)

(73) Assignees: ASML Holding N.V, Veldhoven (NL); ASML Netherlands B.V., Veldhoven (NL)

( * ) Notice: Subject to any disclaimer, the term of this patent is extended or adjusted under 35 U.S.C. 154(b) by 202 days.

(21) Appl. No.: 14/947,628

(22) Filed: Nov. 20, 2015

(65) Prior Publication Data

US 2016/0077443 A1    Mar. 17, 2016

Related U.S. Application Data

(62) Division of application No. 12/921,555, filed as application No. PCT/EP2009/002719 on Apr. 14, 2009, now Pat. No. 9,268,241.

(Continued)

(51) Int. Cl.
*G03F 7/20* (2006.01)
*H01L 21/68* (2006.01)

(52) U.S. Cl.
CPC ...... *G03F 7/70741* (2013.01); *G03F 7/70983* (2013.01); *H01L 21/682* (2013.01)

(58) Field of Classification Search
CPC ............. G03F 7/70741; G03F 7/70716; C23C 14/505; B23Q 39/044; B23Q 39/046;
(Continued)

(56) References Cited

U.S. PATENT DOCUMENTS

| | | | |
|---|---|---|---|
| 3,968,885 A | 7/1976 | Hassan et al. | |
| 4,758,127 A * | 7/1988 | Imai | G03B 23/02 414/411 |

(Continued)

FOREIGN PATENT DOCUMENTS

| | | |
|---|---|---|
| CN | 101006554 A | 7/2007 |
| EP | 1 211 562 A1 | 6/2002 |

(Continued)

OTHER PUBLICATIONS

International Preliminary Report on Patentability and Written Opinion dated Oct. 28, 2010 for International Application No. PCT/EP2009/002719, The International Bureau of WIPO, Geneva, Switzerland; 10 pgs.

(Continued)

*Primary Examiner* — Glenn F Myers
(74) *Attorney, Agent, or Firm* — Sterne, Kessler, Goldstein & Fox P.L.L.C.

(57) ABSTRACT

Provided is a method and apparatus for moving and exchanging reticles within a vacuum lithographic system with minimum particle generation and outgassing. In an example of the method, a first arm of a rotational exchange device (RED) receives a first baseplate holding a first reticle. A second arm of the RED supports and buffers a second baseplate. The first and second baseplates are located substantially equidistant from an axis of rotation of the RED.

18 Claims, 13 Drawing Sheets

Related U.S. Application Data

(60) Provisional application No. 61/071,268, filed on Apr. 18, 2008.

(58) Field of Classification Search
CPC .... B23Q 39/04; B23Q 39/042; B23Q 16/065; B23Q 16/06; B23Q 7/02; C03B 35/125; B25J 9/04; B25J 9/045; B25J 9/046; B25J 9/10; H01L 21/68707; H01L 21/67742; H01L 21/67745; H01L 21/67778; H01L 21/67766; H01L 21/6835; H01L 21/68771; H01L 21/67359; H01L 21/682; H01L 21/67757; H01L 21/6773; H01L 21/67236
See application file for complete search history.

(56) References Cited

U.S. PATENT DOCUMENTS

| | | | |
|---|---|---|---|
| 4,984,953 A * | 1/1991 | Nakazato | H01L 21/6838 220/260 |
| 5,135,349 A | 8/1992 | Lorenz et al. | |
| 5,324,155 A | 6/1994 | Goodwin et al. | |
| 5,807,062 A | 9/1998 | Schultz et al. | |
| 5,959,721 A | 9/1999 | Nishi | |
| 6,064,029 A | 4/2000 | Kempf et al. | |
| 6,158,951 A | 12/2000 | Carr et al. | |
| 6,293,746 B1 | 9/2001 | Ogawa et al. | |
| 6,379,095 B1 | 4/2002 | Elliott et al. | |
| 6,414,744 B1 | 7/2002 | Kuiper et al. | |
| 6,473,157 B2 | 10/2002 | Nakahara | |
| 6,549,825 B2 | 4/2003 | Kurata | |
| 6,589,789 B1 * | 7/2003 | Hubert | G01N 35/0099 422/504 |
| 6,675,666 B2 | 1/2004 | Maruyama et al. | |
| 7,053,393 B2 | 5/2006 | Taniguchi et al. | |
| 7,078,708 B2 | 7/2006 | Bartray et al. | |
| 7,278,817 B2 | 10/2007 | Friedman et al. | |
| 7,304,720 B2 | 12/2007 | del Puerto et al. | |
| 2003/0017034 A1 | 1/2003 | Davis et al. | |
| 2003/0133762 A1 | 7/2003 | Yamamoto et al. | |
| 2004/0019408 A1 | 1/2004 | del Puerto et al. | |
| 2004/0240971 A1 | 12/2004 | Tezuka | |
| 2005/0078284 A1 | 4/2005 | Van De Ven et al. | |
| 2005/0117142 A1 | 6/2005 | Heerens et al. | |
| 2005/0121144 A1 | 6/2005 | Edo et al. | |
| 2005/0275998 A1 | 12/2005 | Kamono | |
| 2006/0010681 A1 | 1/2006 | Bernhard et al. | |
| 2006/0061750 A1 | 3/2006 | Van De Ven | |
| 2006/0066834 A1 | 3/2006 | Phillips et al. | |
| 2006/0087636 A1 | 4/2006 | Kuit et al. | |
| 2006/0087638 A1 | 4/2006 | Hirayanagi | |
| 2006/0132732 A1 | 6/2006 | Kuit | |
| 2006/0138681 A1 | 6/2006 | Best et al. | |
| 2006/0245905 A1 | 11/2006 | Hudgens | |
| 2006/0291982 A1 | 12/2006 | Tanaka | |
| 2007/0002516 A1 | 1/2007 | Matsumoto | |
| 2007/0109523 A1 | 5/2007 | Mochizuki | |
| 2007/0146681 A1 | 6/2007 | Yamamoto | |
| 2007/0206173 A1 * | 9/2007 | Suzuki | G03F 1/66 355/75 |
| 2007/0280813 A1 | 12/2007 | Nakamura et al. | |
| 2008/0025821 A1 | 1/2008 | White et al. | |
| 2008/0138176 A1 | 6/2008 | Kim | |
| 2011/0020104 A1 | 1/2011 | Lansbergen et al. | |

FOREIGN PATENT DOCUMENTS

| | | | |
|---|---|---|---|
| EP | 1 806 774 A1 | 7/2007 | |
| JP | 63258341 A * | 10/1988 | |
| JP | 09-008103 A | 1/1997 | |
| JP | 09-186218 A | 7/1997 | |
| JP | 09186072 A * | 7/1997 | ......... G03F 7/70741 |
| JP | 2001-024045 A | 1/2001 | |
| JP | 2001024045 A * | 1/2001 | ........... G03F 7/7075 |
| JP | 2004-158643 A | 6/2004 | |
| JP | 2006-351863 A | 12/2006 | |
| JP | 2006351863 A * | 12/2006 | |
| JP | 2007-141925 A | 6/2007 | |
| TW | 490368 B | 6/2002 | |
| TW | 200302955 A | 8/2003 | |
| TW | 200816353 A | 4/2008 | |

OTHER PUBLICATIONS

International Search Report dated Jul. 31, 2009 for International Patent Application No. PCT/EP2009/002719, 4 pgs.

* cited by examiner

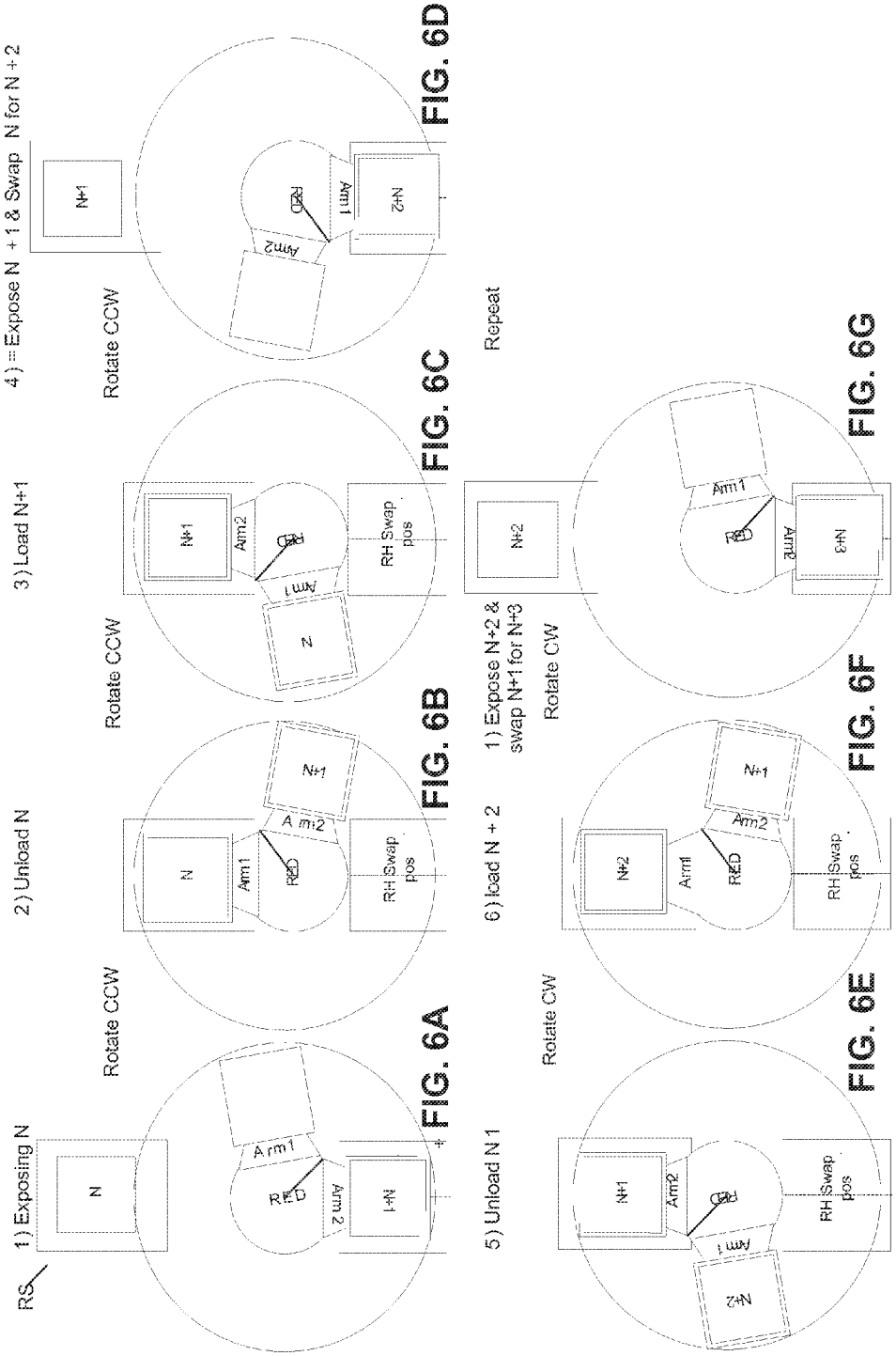

RAPID EXCHANGE DEVICE FOR LITHOGRAPHY RETICLES

This application incorporates by reference in their entireties U.S. patent application Ser. No. 12/921,555, filed Sep. 8, 2010 and U.S. provisional application 61/071,268, filed Apr. 18, 2008.

BACKGROUND

Field of the Invention

The present invention relates to a lithographic apparatus and a method for manufacturing a device.

Background Art

Lithography is widely recognized as a key processes in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

The market demands that the lithographic apparatus perform the lithography process as quickly as possible to maximize manufacturing capacity and keep costs per device low. Thus, it is preferable that changing reticles during the lithography process takes the least possible time. Unfortunately, conventional reticle exchange devices are not designed to function in a vacuum environment, and those that are designed to function in a vacuum environment are not fast enough. They also tend to exhibit problems with vacuum sealing and have a large quantity of bearings, both of which lead to further problems of outgassing and particulate contamination.

Particulate contamination causes manufacturing defects which waste production capacity, time, and materials. Outgassing can contaminate lenses which reduces the effective exposure power and reduces productivity or destroys lenses entirely. This waste reduces foundry efficiency and increases fabrication expenses.

SUMMARY

It is desirable to provide a reticle exchange device and device manufacturing method that addresses the problem of rapid reticle exchange with minimum particle generation and outgassing in a vacuum lithography system.

According to an aspect of the invention, there is provided a method for rapidly exchanging lithography reticles. A first arm of a rotational exchange device (RED) receives a first baseplate holding a first reticle. A second arm of the RED supports and buffers a second baseplate. The first and second baseplates are located substantially equidistant from an axis of rotation of the RED.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6A-G depict exemplary dynamic operation of a rotational exchange device according to an embodiment of the invention.

Figure 1:
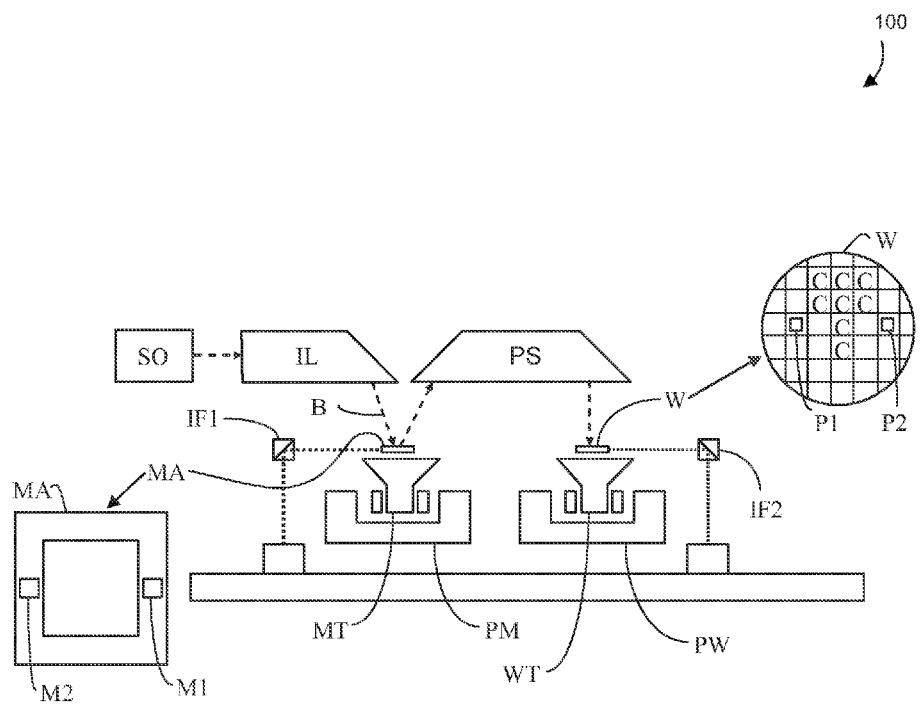
FIG. 1 depicts a lithographic apparatus, according to an embodiment of the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus 100 according to one embodiment of the invention. The lithographic apparatus 100 comprises an illumination system (illuminator) EL configured to condition a radiation beam B (e.g., EUV radiation); a support structure (e.g., a mask table) MT configured to support a patterning device (e.g., a mask or a reticle) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. The lithographic apparatus 100 also has a projection system (e.g., a reflective projection lens system) PS configured to project a pattern imparted to the radiation beam B by patterning device MA onto a target portion (e.g., comprising one or more dies) C of the substrate W.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

As here depicted, the lithographic apparatus 100 is of a reflective type (e.g., employing a reflective mask). Alternatively, the lithographic apparatus 100 may be of a transmissive type (e.g., employing a transmissive mask).

The lithographic apparatus 100 may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIG. 1, the illuminator IL receives a radiation beam from a radiation source SO. The source SO and the lithographic apparatus 100 may be separate entities, for example when the source SO is an excimer laser. In such cases, the source SO is not considered to form part of the lithographic apparatus 100, and the radiation beam B passes from the source SO to the illuminator IL with the aid of a beam delivery system BD (not shown) comprising, for example, suitable directing mirrors and/or a beam expander. In other cases the source SO may be an integral part of the lithographic apparatus 100, for example when the source SO is a mercury lamp. The source SO and the illuminator IL, together with the beam delivery system BD if required, may be referred to as a radiation system.

The illuminator EL may comprise an adjuster AD (not shown) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components not shown, such as an integrator and a condenser. The illuminator IL may be used to condition the radiation beam B, to have a desired uniformity and intensity distribution in its cross section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted lithographic apparatus 100 may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g. mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

In an embodiment of the invention, there is provided a method for exchanging reticles MA in a vacuum environment of the lithography tool 100, such as an Extreme Ultraviolet (EUV) lithography tool, that uses a rotational Rapid Exchange Device (RED) to minimize reticle exchange time, particle generation, and outgassing. The method calls for handling a baseplate holding the reticle MA instead of gripping the reticle MA directly with the RED during exchange of the reticle MA. To minimize the reticle exchange time, the RED has at least two robotic grippers that each hold a respective baseplate. Each baseplate may hold a respective reticle MA. By using the multiple robotic grippers, loading of a first reticle to the RED, prealignment of a second reticle (if required), transfer of a third reticle to a reticle stage, and buffering of a baseplate for the third reticle may be performed substantially concurrently. By using multiple grippers, the time for storing a reticle, retrieving a second reticle, and transferring the second reticle to a reticle stage is reduced because at least a part of loading and unloading of multiple reticles at various positions is performed substantially simultaneously instead of serially. The RED also saves time by moving multiple reticles from one position to another substantially simultaneously instead of serially.

The RED also protects the reticles, as well as unfinished lithography products. The rotational parts of the RED have at least one sealed chamber that holds a motor system, which rotates the RED. The sealed chamber minimizes particulate contamination and outgassing from motor system parts, such as the motor, motor bearings, a position encoder, etc. A scavenging seal, also known as a differential seal or a differentially pumped seal, is used between rotating components and the sealed chamber to maintain a vacuum in the clean vacuum environment outside the RED, while reducing particulate contamination and outgassing from entering the clean vacuum environment. The RED also may have at least one additional sealed chamber that holds a translational mechanism, which translates the RED along the RED's axis of rotation. This second chamber has bellows to separate a vacuum from dirty components in the translational mechanism, such as an actuator, bearings, etc. The RED's bellows reduce particulate contamination and outgassing entering the vacuum.

FIGS. 2A-2E illustrate an embodiment of the invention that has a two-armed rotational exchange device (RED) 200. Following are FIGS. 3A-3D, which show an embodiment of the invention that has a three-armed rotational exchange device (RED) 300. Although two- and three-armed REDs 200, 300 are illustrated, these examples are not limiting. Various embodiments may have two or more arms, and thus simultaneously transport two or more reticles. Also, in various embodiments, a first arm of a RED may be fixed at any angle relative to a second arm of the RED.

Figure 2A:
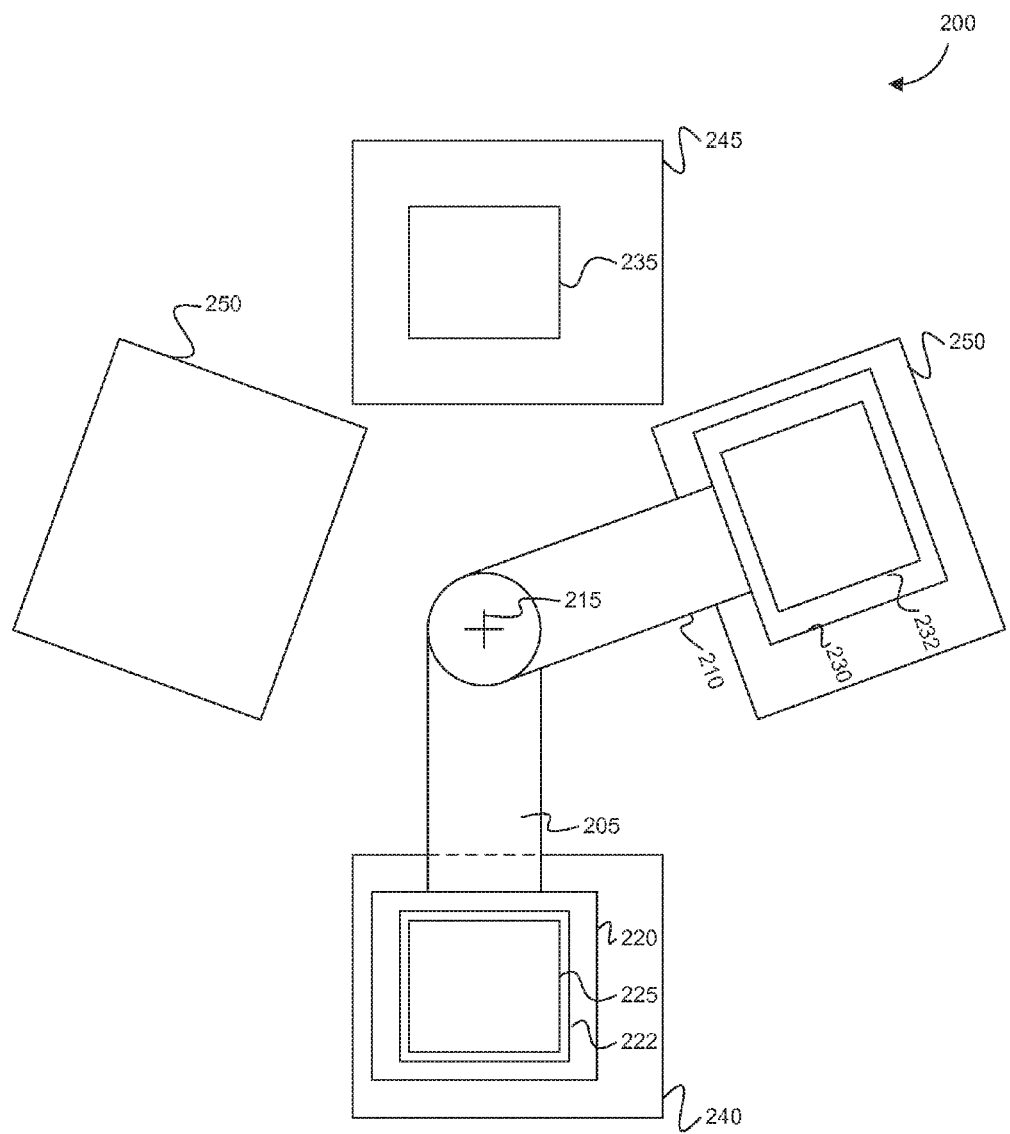
FIG. 2A depicts a top-view of a two-armed rotational exchange device, according to an embodiment of the invention.

FIG. 2A depicts a top-view of the two-armed rotational exchange device 200. The two-armed RED 200 has a first arm 205 and a second arm 210 that rotate about a central axis 215, which runs into the page. At an end of the first arm 205 is a first robotic gripper 220 that is configured to grip a first baseplate 222, which is configured to hold a first reticle 225. Similarly, at the end of the second arm 210 is a second robotic gripper 230 that is configured to grip a second baseplate 232, which is capable of holding a second reticle 235. Thus, the first arm 205 and the second arm 210 are baseplate supports.

The first and second baseplates 222, 232 and the first and second arms 205, 210 are configured to rotate in unison. In an embodiment, the first and second baseplates 222, 232 are located substantially equidistant from the central axis 215. In an embodiment, the first arm 205 is located at-an angle substantially ninety degrees from the second arm 210.

According to an embodiment of the invention, the two-armed RED 200 rotates to three positions. The first position is a reticle loading and unloading position 240. In the reticle loading and unloading position 240, a first baseplate 222 holding the first reticle 225 is transferred between the first robotic gripper 220 and a reticle storage device by a first robotic device (not shown). The second position is a reticle stage loading and unloading position 245. In the reticle stage loading and unloading position 245, the first reticle 225 is transferred between the first baseplate 222 and a reticle stage (not shown), such as the support structure MT in the lithographic apparatus 100 of FIG. 1. The first reticle 225 can be transferred by the RED 200 directly to the reticle stage (not shown). The third position is a baseplate buffering position 250. When the first reticle 225 is located on the reticle stage, the two-armed RED 200 rotates and moves the first robotic gripper 220 and the first baseplate 222 to the baseplate buffering position 250 to keep the two-armed RED 200 from interfering with use of the first reticle 225. It is to be appreciated that in the various positions, the second reticle 235 may be processed and exchanged in a manner similar to that of the first reticle 225. Dynamic operation of the two-armed RED 200 is described in further detail elsewhere herein.

Figure 2B:
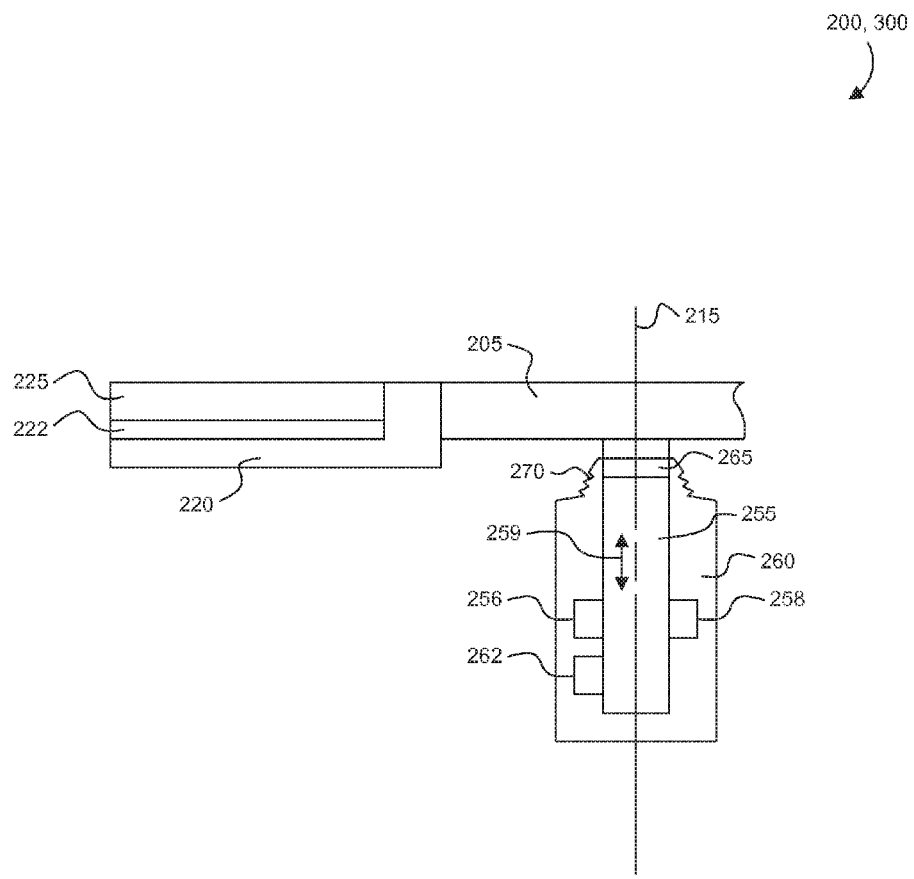
FIG. 2B depicts a side view of a rotational exchange device, according to an embodiment of the invention.

FIG. 2B depicts a partial side view of the two- and three-armed rotational exchange devices 200, 300, according to embodiments of the invention. For simplicity, only one exemplary arm, the first arm 205, is shown in FIG. 2B. Other arms of the two- and three-armed rotational exchange devices 200, 300 may have a similar arrangement.

FIG. 2B shows that at a distal end of the first arm 205 is found the first robotic gripper 220 holding the first baseplate 222, which in turn holds the first reticle 225. The first arm 205 rotates about the central axis 215 through being coupled to a shaft 255. The shaft 255 is mechanically coupled to a motor system 256, which is configured to rotate the shaft 255. An optional position encoder 258 may be coupled to the shaft 255 to provide positional feedback. In the example illustrated in FIG. 2B, the shaft 255 not only rotates, but also is translatable, as shown by arrow 259, along the axis of rotation 215, so that the RED 200, 300 is translatable along the axis of rotation 215. Translation of the RED 200, 300 permits transfer of baseplates and reticles at different heights along the central axis 215. An actuator 262 is mechanically coupled to the shaft 255 to translate the shaft 255 along the axis of rotation 215.

The motor system 256 and actuator 262 are sealed in a chamber 260, such that outgassing and particle contamination from the motor system is substantially eliminated from the clean vacuum when compared to conventional reticle exchange devices. The chamber 260 is sealed about the shaft 255 with a seal 265, such as a scavenging seal which further eliminates particle generation that would be present with a traditional O-ring seal and outgassing grease that would be required for the tradition O-ring seal. Flexible bellows 270 keep the chamber 260 sealed when the shaft 255 translates along the axis of rotation 215.

Figure 2C:
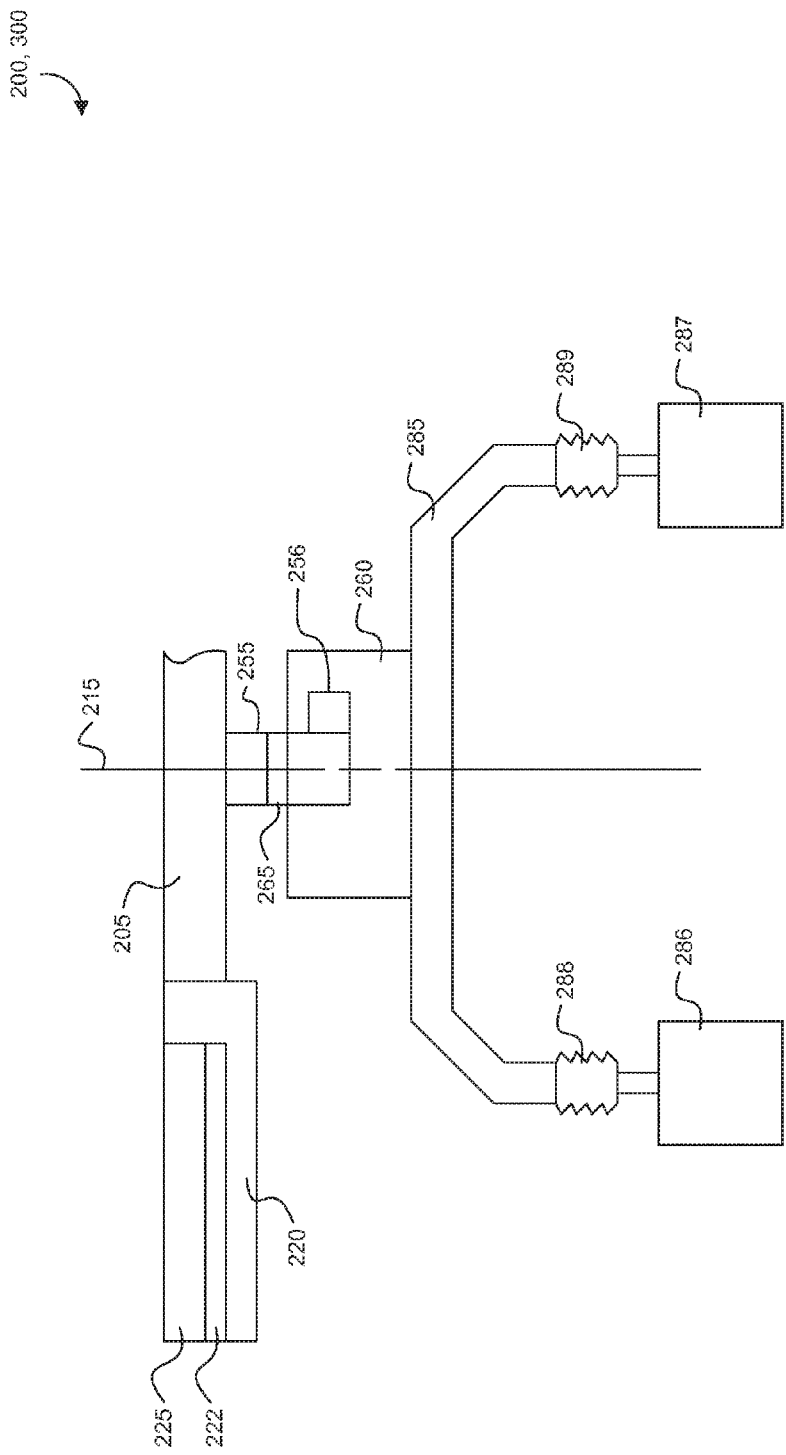
FIG. 2C depicts a side-view of a rotational exchange device having a support, according to an embodiment of the invention.

FIG. 2C depicts a side view of the two- and three-armed rotational exchange devices 200, 300 that is an alternative arrangement to that shown in FIG. 2B, according to one embodiment of the invention. As in FIG. 2B, for simplicity, only one exemplary arm, the first arm 205, is shown in FIG. 2C. Other arms of the two- and three-armed rotational exchange devices 200, 300 may have a similar arrangement.

The chamber 260 in FIG. 2C contains a motor system 256 to rotate the shaft 255. The chamber 260 is mounted on a support 285, which is coupled to actuators 286, 287, which translate the shaft 255, the chamber 260, and the frame 285 along the axis of rotation 215. The actuators 286, 287 have respective flexible bellows 288, 289 to seal the actuators 286, 287 from the surrounding atmosphere, such as a vacuum, when the shaft 255 translates along the axis of rotation 213. Use of the bellows 288, 289 substantially eliminates outgassing and particle contamination from the actuators 286, 287 when compared to those of conventional reticle exchange devices.

Figure 2D:
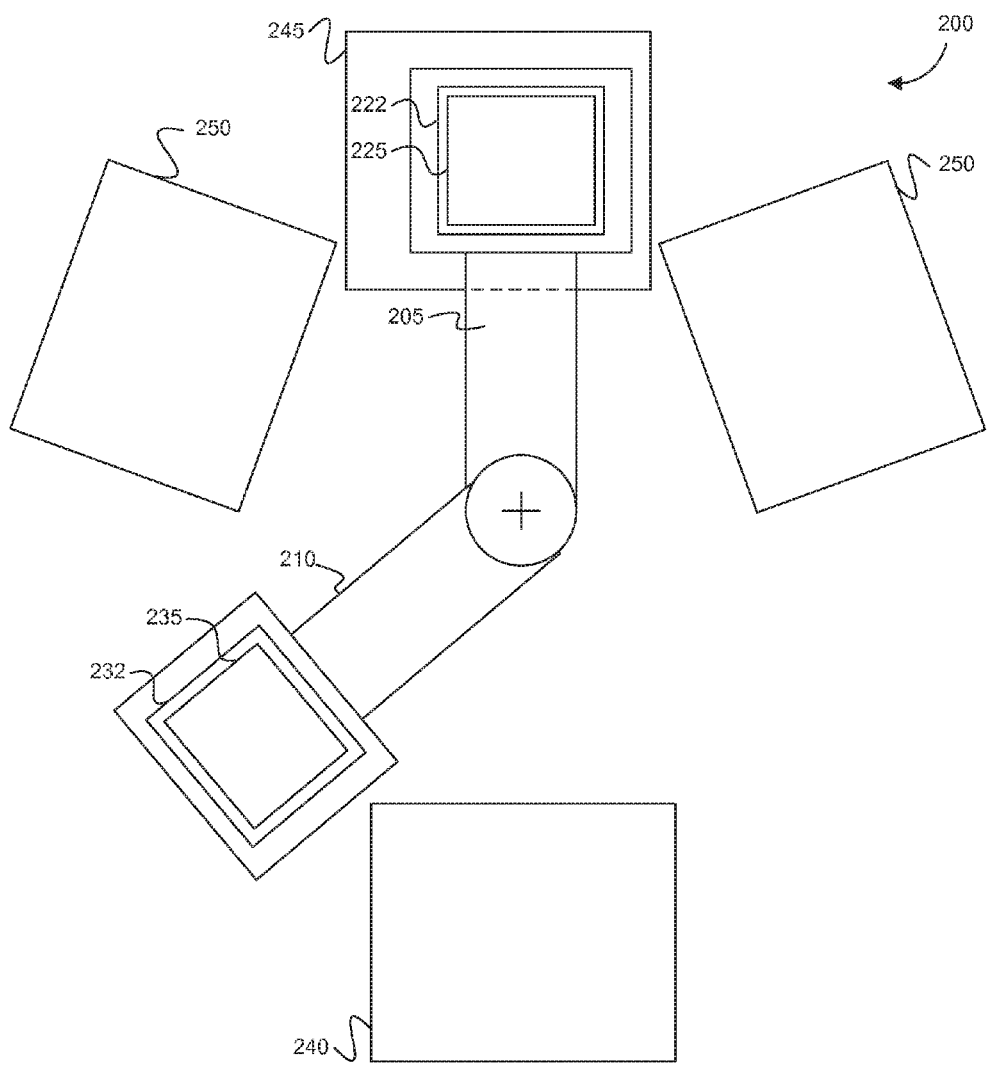
FIGS. 2D-E depict a top-view of a two-armed rotational exchange device, according to an embodiment of the invention.
Figure 2E:
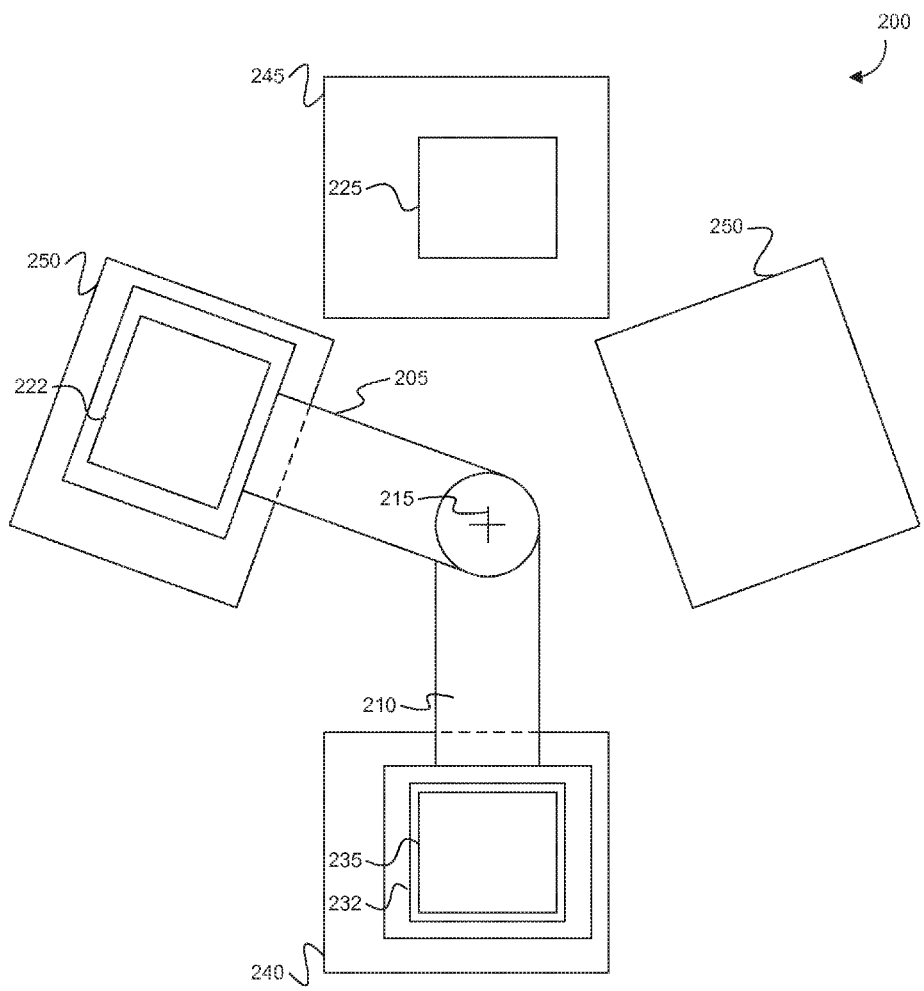

A combination of FIGS. 2A, 2D, and 2E illustrates exemplary dynamic operation of the two-armed RED 200. FIG. 2A shows the first arm 205 in the reticle loading and unloading position 240, where the first reticle 225 and baseplate 222 is loaded on the first arm 220. The two-armed rotational exchange device 200 then rotates the first arm 205 to the reticle stage loading and unloading position 245 as shown in FIG. 2D. After the first reticle 225 is loaded to the reticle stage from the first baseplate 222, the first arm 205, still holding the first baseplate 222, is rotated to the baseplate buffering position 250, which is illustrated in FIG. 2E.

While the first arm 205 is in the baseplate buffering position 250, the first reticle 225, at position 245, is used to impart a radiation beam with the pattern in its cross-section, such as to create the pattern in a target portion of a substrate. When the first reticle 225 is no longer needed for patterning, the first arm 205, still holding the first baseplate 222, returns to the reticle stage loading and unloading position 245, where the first reticle 225 is unloaded from the reticle stage back onto the first baseplate 222. The two-armed rotational exchange device 200 then rotates the first arm 205 back to the reticle loading and unloading position 240 as shown in FIG. 2A, where the first reticle 225 with the baseplate 222 is unloaded from the two-armed RED 200.

While the first baseplate 222 is buffered in the baseplate buffering position 250, the second reticle 235 is substantially simultaneously transferred at the reticle loading and unloading position 240 between the RED and the reticle storage device. Substantially simultaneous buffering of the first baseplate 222 and transfer of the second reticle 235 saves time and increases throughput of the RED 200 when compared to conventional reticle exchange devices.

FIGS. 6A-6G depict exemplary dynamic operation of a rotational exchange device, such as the two-armed RED 200, according to an embodiment of the invention. In FIGS. 6A-6G, a reticle is identified by an identifier number "N." A reticle stage location is denoted by "RS." A location for the reticle handler is indicated as "RH." In one embodiment, operation of the rotational exchange device as shown in FIGS. 6A-G is similar to that as described above with regard to the two-armed RED 200, with the exceptions of any differences depicted in FIGS. 6A-G, as would be apparent to a skilled artisan.

Figure 3A:
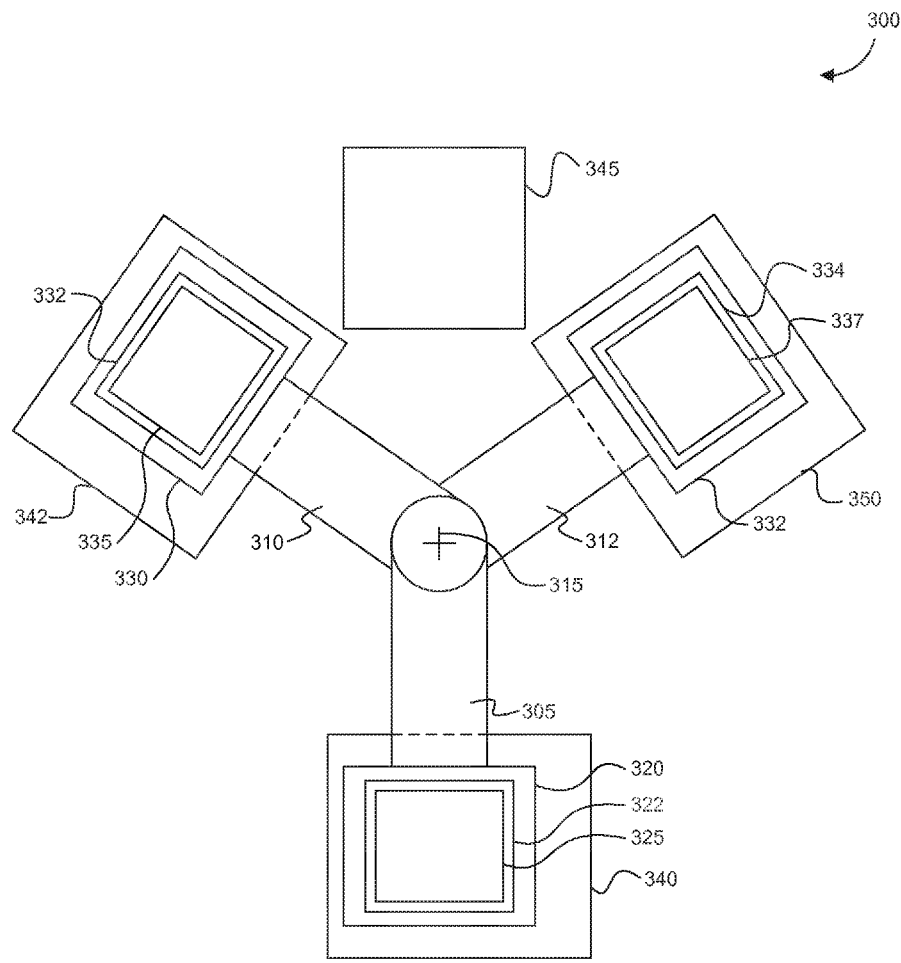
FIGS. 3A-D depict a top-view of a three-armed rotational exchange device, according to an embodiment of the invention.
Figure 3B:
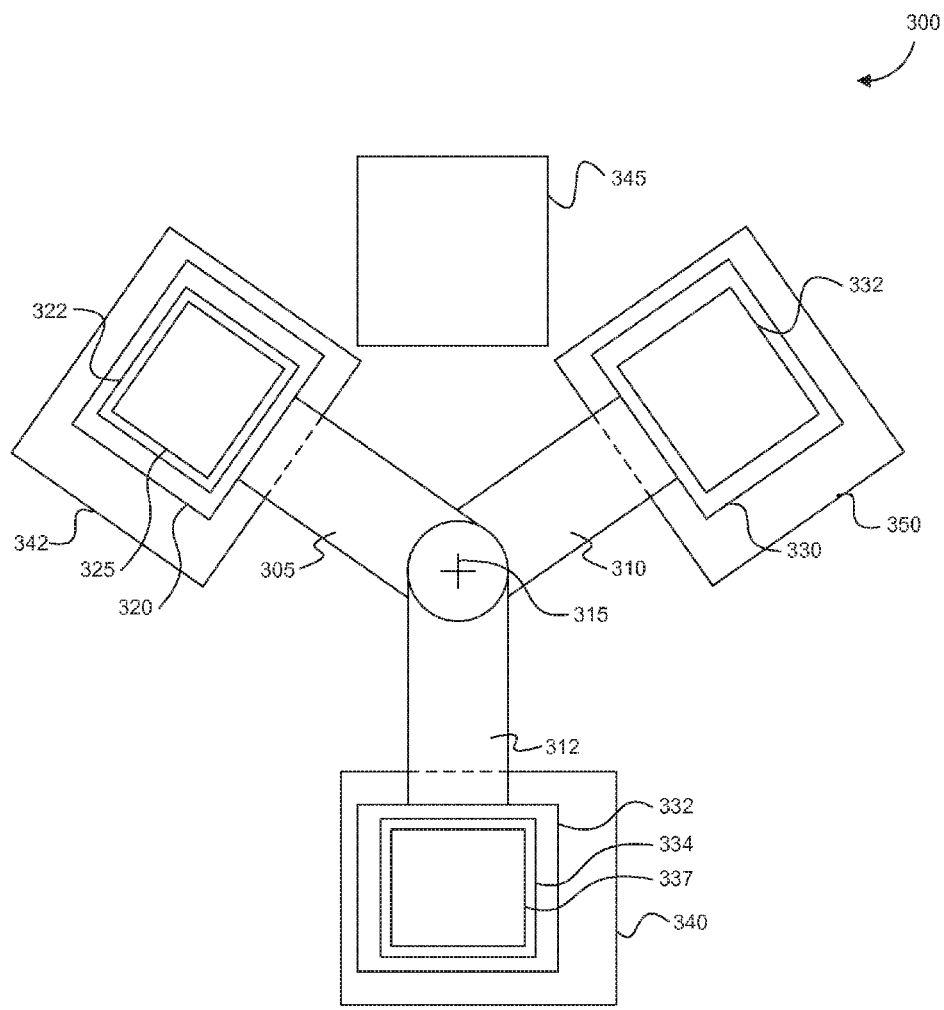

FIG. 3A depicts a top-view of the three-armed rotational exchange device (RED) 300. The three-armed RED 300 has a first arm 305, a second arm 310, and a third arm 312 that rotate about a central axis 315, going into the page. At an end of the first arm 305 is a first robotic gripper 320 that is configured to grip a first baseplate 322, which is configured to hold a first reticle 325. Similarly, at the end of the second arm 310 is a second robotic gripper 330 that is configured to grip a second baseplate 332, which is configured to hold a second reticle 335. At the end of the third arm 312 is a third robotic gripper 332 that is configured to grip a third baseplate 334, which is configured to hold a third reticle 337. The first, second, and third baseplates 322, 332, 334 and the first, second, and third arms 305, 310, 312 are configured to rotate in unison. In an embodiment, the first, second, and third baseplates 322, 332, 334 are located substantially equidistant from the central axis 315.

According to an embodiment of the invention, the three-armed RED 300 rotates through four positions. The first position is a reticle loading and unloading position 340, where reticles and baseplates are loaded from a reticle storage device (not shown) onto a RED arm. In the reticle loading and unloading position 340, the first reticle 325 and the first baseplate 222 are either transferred to or from the first robotic gripper 320 to the reticle storage device. The second position is a reticle prealignment position 342. In the reticle prealignment position 342, the first reticle 325 is prealigned prior to transfer to a reticle stage (not show), such as the support structure MT in the lithographic apparatus 100, shown in FIG. 1. The third position is a reticle stage loading and unloading position 345. In the reticle stage loading and unloading position 345, the first reticle 325 is transferred between the first baseplate 322 and the reticle stage (not shown). The fourth position is a baseplate buffering position 350. When the first reticle 325 is located on the reticle stage, the three-armed RED 300 rotates the first robotic gripper 320 and the first baseplate 322 to the baseplate buffering position 350 to keep the three-armed RED 300 from interfering with use of the first reticle 325, for example during patterning of a beam of radiation for an exposure operation. In the various positions, the second reticle 335 may be processed and exchanged in a manner similar to that of the first reticle 325. Similarly, in the various positions, the third reticle 337 may be processed and exchanged in a manner similar to that of the first reticle 325. Dynamic operation of the three-armed RED 300 is now described in further detail.

The combination of FIGS. 3 A-D illustrate exemplary dynamic operation of the three-armed RED 300. FIG. 3A shows the first arm 305 in the reticle loading and unloading position 340, where the first reticle 325 and baseplate 322 is loaded on the first RED arm 305 from the reticle storage device by a first robotic device (not shown). The three-armed RED 300 then rotates the first arm 305 to the reticle prealignment position 342, as shown in FIG. 3B, where the first reticle 325 is prealigned. Following reticle prealignment, the three-armed RED 300 then rotates the first arm 305 to the reticle stage loading and unloading position 345, as shown in FIG. 3C. After the first reticle 325 is loaded to the reticle stage from the first baseplate 322, the first arm 305, still holding the first baseplate 322, is rotated to the baseplate buffering position 350, which is illustrated in FIG. 3D.

Figure 3C:
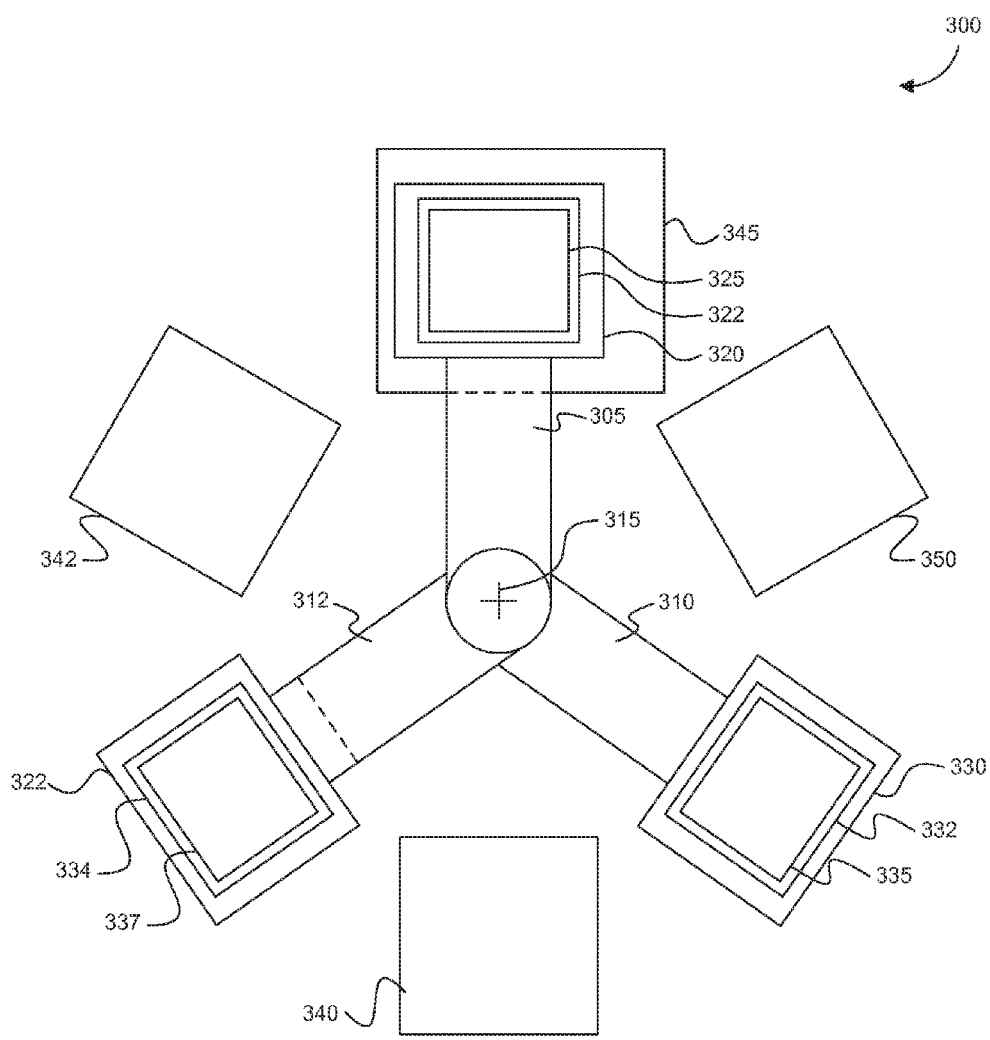
Figure 3D:
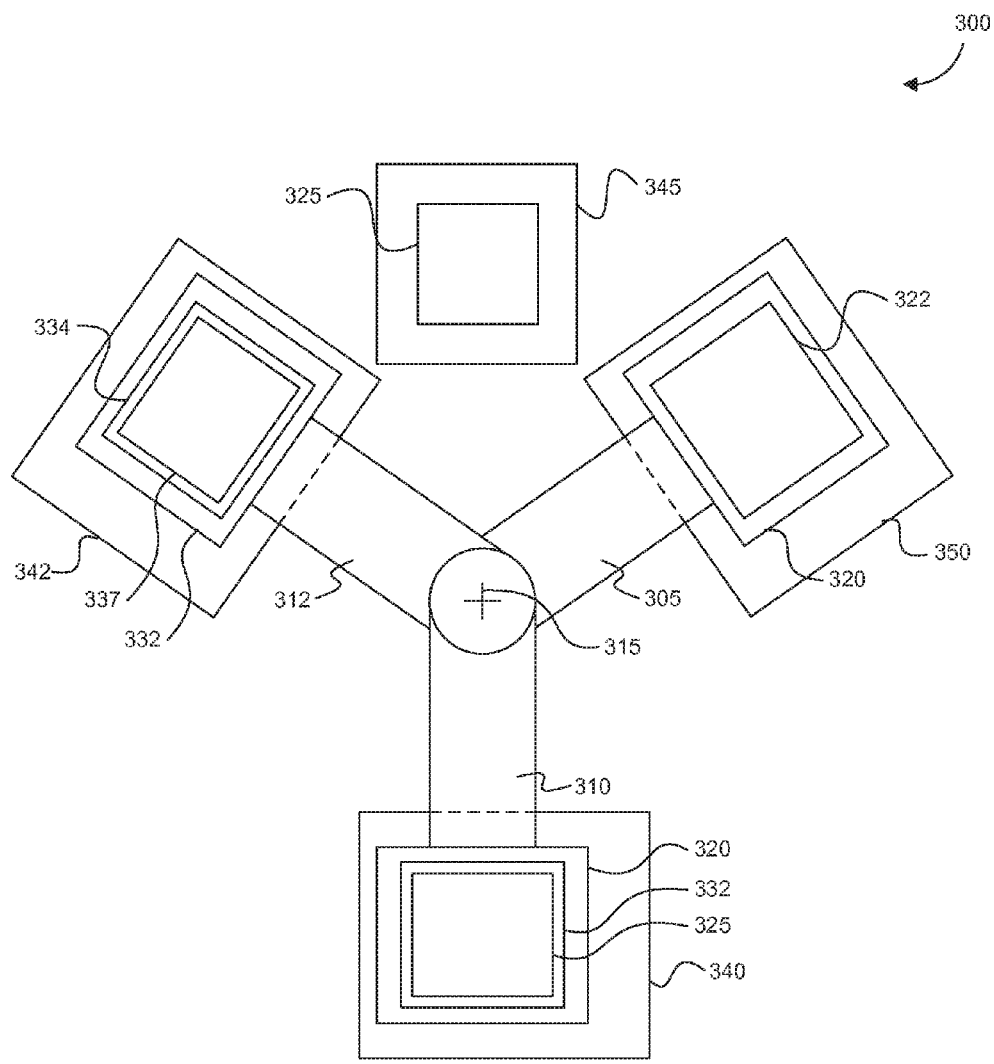

While the first arm 305 is in the baseplate buffering position 350, the first reticle 325 is used to impart a radiation beam with a pattern in its cross-section, such as to create the pattern in a target portion of a substrate. When the first reticle 325 is no longer needed for patterning, the first arm 305, still holding the first baseplate 322, returns to the reticle stage loading and unloading position 345, as shown in FIG. 3C, where the first reticle 325 is unloaded from the reticle stage back onto the first baseplate 322. The three-armed RED 300 then rotates the first arm 305 back to the reticle loading and unloading position 340 as shown in FIG. 3A, where the first reticle 325 with the first baseplate 322 is unloaded from the three-armed RED 300 by the first robotic device.

While the first reticle 325 is being prealigned in the reticle prealignment position 342, the second arm 310 is located in the baseplate buffering position 350, where the second baseplate 332 may be buttered. Also, while the first reticle 325 is being prealigned in the reticle prealignment position 342, the third arm 312 is located at the reticle loading and unloading position 340, where the third reticle 337 with the third baseplate 334 may be loaded onto, or unloaded from, the three-armed RED 300. Prealignment of the first reticle 325, buffering of the second baseplate 332, and transfer of the third reticle 337 is performed substantially simultaneously to save processing time and increase throughput of the three-armed RED 300 when compared to conventional vacuum reticle exchange devices such as a single arm vacuum robot. When the three-armed RED 300 is rotated, the first, second, and third baseplates 322, 332, 334 also rotate substantially simultaneously, so that multiple reticles are moved between the processing positions substantially simultaneously to save processing time and increase throughput of the three-armed RED 300 when compared to conventional reticle exchange devices.

Figure 4:
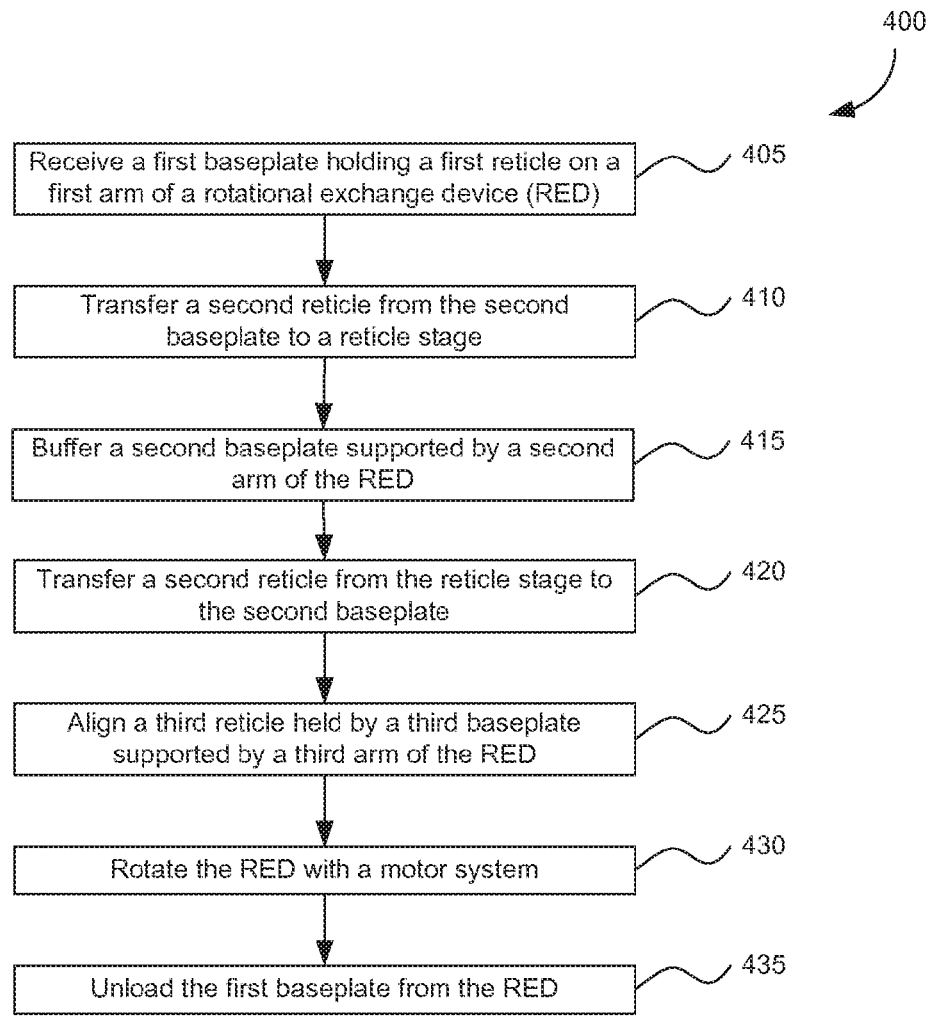
FIG. 4 depicts a method according to an embodiment of the invention.

FIG. 4 is a flowchart that illustrates an exemplary method 400. For example, method 400 may be performed using the devices of FIGS. 1, 2A-E, and 3A-D. In step 405, a first baseplate holding a first reticle on a first arm of a rotational exchange device (RED) is received. In step 410, a second reticle is transferred from the second baseplate to a reticle stage. In step 415, a second baseplate supported by a second arm of the RED is buffered. In one example, the first and second baseplates are located substantially equidistant from an axis of rotation of the RED. The buffering may optionally be performed simultaneously with the receiving. In step 420, a second reticle is transferred from the reticle stage to the second baseplate. In step 425, a third reticle held by a third baseplate supported by a third arm of the RED is prealigned.

In step 430, the RED is rotated with a motor system. The motor system is sealed in an evacuated chamber, such that outgassing and particle contamination from the motor system is substantially eliminated. The RED may be rotated to move any of the baseplates to any of the positions. For example, the RED may be rotated to move the first baseplate to a position that allows for prealignment of the first reticle or rotated to move the first baseplate to a position that allows for transfer of the first reticle to the reticle stage. Further, the RED may be rotated to move the first baseplate to a position that allows for transfer of the first reticle from the reticle stage to the first baseplate or rotated to move the first baseplate to a position that allows for buffering the first baseplate. In another example, the RED is rotated to move the first baseplate to a position that allows for transfer of the first baseplate off of the RED. In step 435, the first baseplate is unloaded from the RED.

All steps in the method 400, other than step 405 and step 415 are optional. In an embodiment, at least a part of the method 400 may be performed by at least a part of the lithographic apparatus 100, the two-armed RED 200, and/or the three-armed RED 300.

Figure 5:
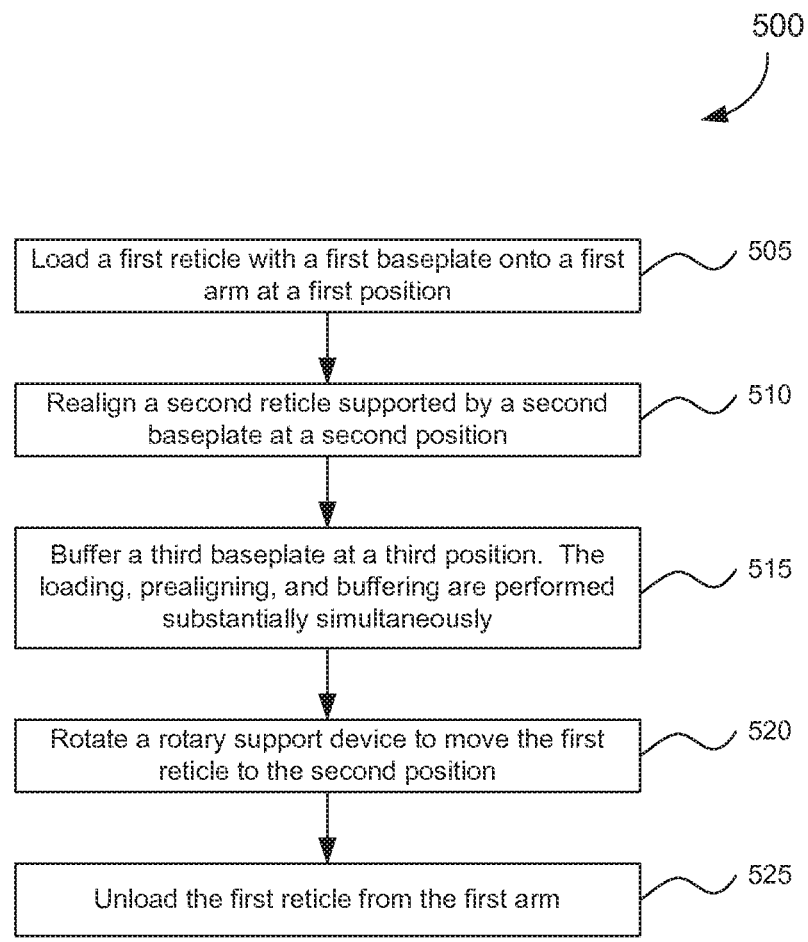
FIG. 5 depicts another method according to an embodiment of the invention.

FIG. 5 is a flowchart that illustrates an exemplary method 500. In an embodiment, at least a part of the method 500 may be performed by at least a part of the lithographic apparatus 100, the two-armed RED 200, and/or the three-armed RED 300. In step 505, a first reticle with a first baseplate is loaded onto a first position. In step 510, a second reticle supported by a second baseplate is prealigned at a second position. In step 515, a third baseplate is buffered at a third position. The loading, prealigning, and buffering may be performed substantially simultaneously. In step 520, the rotary support device is rotated to move the first reticle to the second position. In step 525, the first reticle with the first baseplate is unloaded from the first arm.

Although specific references are made in this text to the use of lithographic apparatus 100 in the manufacture of ICs, it should be understood that the lithographic apparatus 100 described herein may have other applications, such as the manufacture of integrated optical systems, guidance and detection patterns for magnetic domain memories, flat-panel displays, liquid-crystal displays (LCDs), thin film magnetic heads, etc.

Although specific reference are made to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of substantially 5-20 nm), as well as particle beams, such as ion beams or electron beams.

While specific embodiments of the invention have been described, it will be appreciated that the invention may be practiced otherwise than as described. For example, at least a part of the invention may take the form of a computer program containing one or more sequences of machine-readable instructions describing a method as disclosed, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any. of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

The invention claimed is:

1. A method, comprising:
receiving a first baseplate holding a first reticle on a first arm of a rotational exchange device;
buffering a second baseplate supported by a second arm of the rotational exchange device; and
transferring a second reticle from the second baseplate to a reticle stage or from a reticle stage to the second baseplate,
wherein the first and second baseplates are located substantially equidistant from an axis of rotation of the rotational exchange device, and
wherein the reticle stage is unoccupied by any baseplate while either the first baseplate is received or the second baseplate is buffered.

2. The method of claim 1, further comprising:
aligning a third reticle held by a third baseplate supported by a third arm of the rotational exchange device.

3. The method of claim 1, further comprising:
rotating the rotational exchange device with a motor system having an encoder,
wherein the motor system is sealed in an evacuated chamber, such that outgassing and particle contamination from the motor system is substantially eliminated.

4. The method of claim 1, further comprising performing the receiving and the buffering substantially simultaneously.

5. The method of claim 1, further comprising:
unloading the first baseplate from the rotational exchange device.

6. The method of claim 1, further comprising:
transferring a second reticle from the second baseplate to a reticle stage.

7. The method of claim 1, further comprising:
transferring a second reticle from a reticle stage to the second baseplate.

8. The method of claim 1, further comprising:
rotating the rotational exchange device to move the first baseplate to a position that allows for prealignment of the first reticle.

9. The method of claim 1, further comprising:
rotating the rotational exchange device to move the first baseplate to a position that allows for transfer of the first reticle to a reticle stage.

10. The method of claim 1, further comprising:
rotating the rotational exchange device to move the first baseplate to a position that allows for buffering the first baseplate.

11. The method of claim 1, further comprising:
rotating the rotational exchange device to move the first baseplate to a position that allows for transfer of the first baseplate off of the rotational exchange device.

12. A method, comprising:
loading a first reticle with a first baseplate onto a first position;
prealigning a second reticle supported by a second baseplate at a second position; and
buffering a third baseplate at a third position,
wherein the loading, prealigning, and buffering are performed substantially simultaneously, and
wherein the second and third positions are located at substantially equal and fixed distances relative to the first position.

13. The method of claim 12, further comprising:
rotating a rotary support device to move the first reticle to the second position.

14. The method of claim 12, further comprising:
unloading the first reticle with the first baseplate from a first arm of a rotary support device.

15. A method comprising:
receiving a first baseplate holding a first reticle on a first arm of a rotational exchange device at a first position;
unloading the first reticle on the first arm at a second position;
buffering the first baseplate on the first arm at a third position; and
loading the first reticle onto the first baseplate on the first arm at the second position,
wherein the second position is unoccupied by any baseplate during receiving or buffering.

16. The method of claim 15, further comprising:
transferring a second reticle on a second arm of the rotational exchange device at the first position while buffering the first baseplate on the first arm at the third position.

17. The method of claim 15, further comprising:
buffering a second baseplate on a second arm of the rotational exchange device at the third position while receiving the first baseplate holding the first reticle on the first arm.

18. The method of claim 15, further comprising:
prealigning a third reticle supported by a third baseplate at a fourth position, wherein the third and fourth positions are located at substantially equal and fixed distances relative to the first position.

* * * * *